(12) United States Patent
Haukka et al.

(10) Patent No.: US 6,806,145 B2
(45) Date of Patent: Oct. 19, 2004

(54) LOW TEMPERATURE METHOD OF FORMING A GATE STACK WITH A HIGH K LAYER DEPOSITED OVER AN INTERFACIAL OXIDE LAYER

(75) Inventors: Suvi Haukka, Helsinki (FI); Eric Shero, Phoenix, AZ (US); Christophe Pomarede, Phoenix, AZ (US); Jan Willem Hub Maes, Hevelee (BE); Marko Tuominen, Helsinki (FI)

(73) Assignee: ASM International, N.V., Bilthoven (NL)

( * ) Notice: Subject to any disclaimer, the term of this patent is extended or adjusted under 35 U.S.C. 154(b) by 0 days.

(21) Appl. No.: 10/227,475

(22) Filed: Aug. 22, 2002

(65) Prior Publication Data

US 2003/0049942 A1 Mar. 13, 2003

Related U.S. Application Data

(60) Provisional application No. 60/316,562, filed on Aug. 31, 2001.

(51) Int. Cl.[7] .............................................. H01L 21/473
(52) U.S. Cl. ..................... 438/287; 438/591; 438/785
(58) Field of Search ................................ 438/216, 240, 438/287, 591, 785

(56) References Cited

U.S. PATENT DOCUMENTS

| | | | |
|---|---|---|---|
| 4,058,430 A | 11/1977 | Suntola et al. ............... 156/611 |
| 5,834,353 A | * 11/1998 | Wu ............................ 438/287 |
| 6,013,553 A | 1/2000 | Wallace et al. |
| 6,015,739 A | 1/2000 | Gardner et al. |
| 6,060,755 A | * 5/2000 | Ma et al. ..................... 257/410 |
| 6,124,158 A | 9/2000 | Dautartas et al. ........... 438/216 |
| 6,133,106 A | 10/2000 | Evans et al. ................ 438/299 |
| 6,144,060 A | 11/2000 | Park et al. ................... 257/310 |
| 6,251,761 B1 | * 6/2001 | Rodder et al. .............. 438/591 |
| 6,348,420 B1 | 2/2002 | Raaijmakers et al. ....... 438/769 |
| 6,380,104 B1 | * 4/2002 | Yu .............................. 438/776 |
| 6,403,156 B2 | * 6/2002 | Jang et al. ............. 427/255.34 |
| 6,417,041 B1 | * 7/2002 | Ibok ............................ 438/240 |
| 6,448,192 B1 | * 9/2002 | Kaushik ...................... 438/785 |
| 2002/0098627 A1 | 7/2002 | Pomarede et al. |

FOREIGN PATENT DOCUMENTS

| | | | | |
|---|---|---|---|---|
| EP | 0 973 189 A2 | * | 1/2000 | ........... H01L/21/28 |
| WO | WO 00/54320 | | 9/2000 | |

OTHER PUBLICATIONS

Tuominen et al., "High–K Oxides by Atomic Layer Chemical Vapour Deposition," Proceedings—Electrochemical Society (2000), 2000–9 (Rapid Thermal and Other Short–Time Processing Technologies), pp. 271–282. The Electrochemical Society, 197th Meeting, Toronto, Ontario, Canada, May 14–18, 2000.

Cui et al., "Rapid thermal oxidation of silicon in ozone." Journal of Applied Physics, vol. 87, No. 11, Jun. 1, 2000, pp. 8181–8186.

(List continued on next page.)

*Primary Examiner*—Thanh Nguyen
*Assistant Examiner*—Stephen W. Smoot
(74) *Attorney, Agent, or Firm*—Knobbe Martens Olson and Bear LLP (57) ABSTRACT

The present invention relates to methods for forming dielectric layers on a substrate, such as in an integrated circuit. In one aspect of the invention, a thin interfacial layer is formed. The interfacial layer is preferably an oxide layer and a high-k material is preferably deposited on the interfacial layer by a process that does not cause substantial further growth of the interfacial layer. For example, water vapor may be used as an oxidant source during high-k deposition at less than or equal to about 300° C.

38 Claims, 1 Drawing Sheet

OTHER PUBLICATIONS

Gusev et al., "Ultrathin High–K Dielectrics grown by Atomic Layer Deposition; A comparative study of $ZrO_2$ $HfO_2$ $Y2O_3$ and $Al_2O_3$." The Electrochemical Society, 199$^{th}$ Meeting, Washington DC. Mar. 25–30, 2001, pp. 189–195.

Chowdhuri et al., "Investigation of the aluminum oxide/Si (1 0 0) interface formed by chemical vapor deposition. "Thin Solid Films 446 (2004) pp. 155–159.

Gusev et al., "Ultrathin $HfO_2$ films grown on silicon by atomic layer deposition for advanced gate dielectric applications." Microelectronic Engineering 69 (2003) pp 145–151.

Gusev et al., "High Resolution depth profiling in ultrathin $Al_2O_3$ films on Si," Applied Physics Letter, vol. 76, No. 2, Jan. 10, 2000, pp. 176–178.

Haukka et al., "Atomic Layer Chemical Vapor Deposition of High–K Gate Dielectrics," Semicon Europa / Semi Education, Munchen, Germany, Apr. 5, 2000.

Hu et al. "Thin Gate Oxide Promise High Reliability," Semiconductor International. Jul. 1998.pp. 215–222.

Kim et al. "Ultra Thin (<3 nm) High Quality Nitride/Oxide Stack Gate Dielectrics Fabricated by In–Situ Rapid Thermal Processing," IEMD. 1997. pp. 463–466.

H. F. Luan et al., "Ultra thin high quality Ta2O5 gate dielectric prepared by in–situ rapid thermal processing", International Electron Devices Meeting, IEDM, 1998, pp. 609–612.

Houssa et al., "Effect of O2 post–deposition anneals on the properties of ultra–thin SiOx/ZrO2 gate dielectric stacks", Semiconductor Science and Technology, vol. 16, No. 1, 01/01, pp. 31–38, 2001.

Wilk et al., "High–Kappa gate dielectrics: Current status and materials properties considerations," American Institute of Physics, vol. 89, No. 10, pp. 5243–5275, May 2001.

Drozd, V.E., "Synthesis of oxide superalloys by ML–ALE method," *Applied Surface Science*, vols. 82/83, pp. 587–590 (1994).

Leskelä, M. et al., "ALD precursor chemistry: Evolution and future challenge," *J. Phys. IV France*, vol. 9, pp. Pr8–837–Pr8–852 (1999).

Niinistö, L. et al., "Synthesis of oxide thin films and overlayers by atomic layer epitaxy for advanced applications," Materials Science and Engineering, vol. B41, pp. 23–29 (1996).

Ritala et al. "Atomic Layer Deposition of Oxide Thin Films with Metal Alkoxides as Oxygen Sources," Science 288:319–321, Apr. 2000.

Suntola, T., "Atomic layer epitaxy," *Thin Solid Films*, vol. 216, pp. 84–89 (1992).

Yang et al. "Conduction Mechanism and Interfacial Properties of Al2O3/Si with a SiO2 Intermediate Layer for Deep Submicron Device Applications," 1999.

* cited by examiner

Figure 1

LOW TEMPERATURE METHOD OF FORMING A GATE STACK WITH A HIGH K LAYER DEPOSITED OVER AN INTERFACIAL OXIDE LAYER

REFERENCE TO RELATED APPLICATION

The present application claims priority under 35 U.S.C. §119(e) to U.S. Provisional Application No. 60/316,562, filed Aug. 31, 2001.

BACKGROUND OF THE INVENTION

1. Field of the Invention

The present invention relates to methods and equipment for forming dielectric stacks in integrated circuits, and particularly to forming a thin oxide interfacial layer under a high-k material.

2. Description of the Related Art

Thin dielectric layers are often desired over semiconductor surfaces in fabricating integrated circuits. Conventional gate dielectrics are formed of high quality silicon dioxide and are typically referred to as "gate oxide" layers. Such layers are typically grown from a single crystal silicon wafer or epitaxial silicon layer. The gate oxide capacitively couples the gate electrode to the channel region between the source and the drain regions in a typical transistor.

As integrated circuits have become smaller, it has become desirable to reduce the thickness of the gate oxide layer. However, ultra thin gate oxides (e.g., less than 5 nm) have been found to exhibit high defect densities, including pinholes, charge trapping states, and susceptibility to hot carrier injection effects. Such high defect densities lead to leakage currents through the gate dielectric and rapid device breakdown that is unacceptable for circuit designs with less than 0.25 $\mu$m gate spacing, i.e., sub-quarter-micron technology.

While care under laboratory conditions can be used to control defect densities, such control has been difficult to achieve under commercial volume fabrication conditions. Moreover, even if the integrity of the oxide is perfectly maintained, quantum-mechanical effects set fundamental limits on the scaling of gate oxide. At high fields, direct tunneling dominates over Fowler-Nordheim tunneling, and largely determines oxide scaling limits. These scaling limits have been estimated at about 2 nm for logic circuits, and about 3 nm for more leakage-sensitive memory arrays in dynamic random access memory (DRAM) circuits. See, e.g., Hu et al., "Thin Gate Oxides Promise High Reliability," SEMICONDUCTOR INTERNATIONAL (July 1998), pp. 215–222.

Theoretically, incorporating materials with a higher permittivity than $SiO_2$ into the gate dielectric opens the door to further device scaling. Due to their higher dielectric constant, such materials can exhibit the same capacitance as a thinner silicon dioxide layer, such that a lower equivalent oxide thickness can be achieved without tunnel-limited behavior. Another advantage of some high dielectric materials is their diffusion barrier properties, such as resistance to boron penetration, and their high thermal conductivity.

The use of high permittivity oxides, such as $Al_2O_3$ and $ZrO_2$ as gate dielectrics has been the focus of a great deal of recent work. The deposition of thin films from high-k materials has been accomplished by numerous techniques, including chemical vapor deposition (CVD), reactive sputtering, molecular beam epitaxy (MBE) and atomic layer deposition (ALD). ALD is a very promising method because it provides control of film thickness and composition at an atomic level leading to uniform, highly conformal deposition.

ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994, the disclosure of which is incorporated herein by reference.

In a typical ALD process for depositing metal oxides, one deposition cycle comprises exposing the substrate to a metal precursor, removing unreacted first reactant and reaction byproducts from the reaction chamber, exposing the substrate to an oxygen precursor followed by a second removal step. It has been suggested that a major problem in the ALD of high-k metal oxides on silicon is that at the beginning of the process the silicon surface is covered with only a monolayer of metal when it is exposed to the oxygen source. Thus, under typical growth conditions a layer of $SiO_2$ is formed. With each subsequent cycle this layer tends to grow and limits the achievable capacitance. A number of solutions to this potential problem have been proposed. For example, it has been found to be possible to deposit aluminum oxide on silicon substrates without creating an interfacial silicon oxide layer by using metal alkoxides, which serve as both a metal and oxygen source in reacting with another metal compound (Ritala et al. Science 288:319–321 (2000)).

However, it has also been suggested that a very thin silicon oxide interface layer is desirable, even for alternative gate dielectric materials, as it provides superior silicon/oxide interface characteristics. For example, Yang et al. (Humantech Thesis Prize, Samsung Electronics (1999)) showed that the presence of a thin silicon oxide layer between aluminum oxide and the silicon substrate produced a superior gate dielectric compared to aluminum oxide alone. Similarly, forming silicon nitride over thin oxide layers has been found to reduce defect densities while considerably lowering overall gate dielectric equivalent oxide thickness. See, e.g., Kim et al., "Ultra Thin (<3 nm) High Quality Nitride/Oxide Stack Gate Dielectrics Fabricated by In-Situ Rapid Thermal Processing," IEDM 97 (1997), pp. 463–466. Methods of depositing a thin interfacial oxide layer between the substrate and a high-k material have been described, for example in U.S. Pat. No. 6,144,060 and in U.S. patent application Ser. No. 09/471,761 filed Dec. 23, 1999.

Prior to thermally growing silicon oxide, the silicon surface is desirably cleaned to avoid contamination and produce superior electrical properties. Among other things, the surface is generally cleaned of a naturally forming oxide known as "native oxide." As is well known in the art, native oxide forms naturally over bare silicon surfaces even upon exposure to clean room environments at room temperature. Typically, native oxide comprises a few angstroms of silicon oxide and therefore makes up a substantial portion of the dielectric film to be formed. While a thermal oxide can be grown through the native oxide to complete the desired dielectric layer, the quality and thickness of the native oxide are inconsistent across the silicon surface. Moreover, the native oxide that results from long transportation and/or storage is typically contaminated with impurities.

Accordingly, native oxide is often removed from the surface with dilute hydrofluoric acid (HF) baths or HF vapor etching. Dipping the wafers in a dilute HF bath cleans the silicon surface of native oxide and leaves the surface hydrogen terminated. HF vapor etching similarly cleans the silicon surface and terminates dangling silicon bonds, but the surface termination includes a substantial fluorine content.

Hydrogen termination is not very stable, particularly at elevated temperatures. The hydrogen atoms readily desorb to leave the dangling silicon bonds that tend to attract atmospheric contaminants. Even with hydrogen and fluorine termination in place, atmospheric oxidants can still diffuse through the termination layer between the HF treatment and subsequent processing. Thus, HF treatment cleans the wafer surface but leaves the surface inadequately protected for the period between cleaning and further processing.

One manner in which a clean silicon surface can be maintained for longer periods of time is to quickly grow a thin silicon oxide layer after cleaning the silicon surface. As mentioned above, an ultra thin $SiO_2$ layer can provide improved interface characteristics between a silicon structure and high dielectric permittivity (high-k dielectric) materials. Spontaneous oxide regrowth, such as by room temperature exposure to typical oxidants like air or water, results in a very slow reaction, which is unacceptable for commercial fabrication.

As is well known, heating the wafer during oxidation can increase the oxidation rate. Unfortunately, thermal oxidation at temperatures greater than 500° C. causes the hydrogen termination left by HF treatment to desorb well before temperatures reach the level at which significant oxidation takes place. In the interim, the silicon surface is left unprotected. Moreover, thermal oxidation of the initially bare silicon substrate proceeds rapidly and by mechanisms that are not well understood, as compared to latter stages during which oxidants diffuse through an already-grown portion of the silicon oxide. Accordingly, when attempting to provide oxide thicknesses appropriate for interface improvement beneath high-k materials, the oxidation is not easily controlled and can easily exceed the desired thickness. Additionally, even if an ultra thin oxide layer is effectively formed as an interfacial layer, under typical growth conditions when the subsequent high-k material is deposited the oxide layer grows further. A silicon oxide interface that is too thick results in a lower overall dielectric constant.

While it is beneficial to have an ultra thin $SiO_2$ interfacial layer between the substrate and the high-k material, the thickness of the $SiO_2$ interface determines the minimum thickness for the gate oxide layer. A need exists, therefore, for forming and maintaining an ultra thin $SiO_2$ interface. Desirably, such methods should be compatible with single-wafer processing systems and sub-quarter-micron technology, yet exhibit higher yield and throughput compared to conventional techniques.

SUMMARY OF THE INVENTION

In one aspect the present invention relates to a process for forming a gate dielectric on a semiconductor substrate by forming an interfacial dielectric oxide layer on the substrate and depositing a high-k layer over the interfacial dielectric. The high-k layer is preferably deposited under conditions such that the thickness of the interfacial dielectric layer does not substantially increase.

In another aspect, the present invention relates to a method of forming a dielectric layer on a silicon substrate. The method preferably comprises growing a silicon oxide interface layer less than about 15 Å thick on the substrate and depositing a high-k material on top of the interface layer. Preferably, depositing comprises maintaining the substrate at a temperature less than about 300° C. and supplying water vapor as an oxidizing agent. Depositing the high-k material preferably grows the interface layer by less than about 15 Å, more preferably by less than about 10 Å and even more preferably by less than about 5 Å.

In one embodiment depositing comprises an ALD process. The ALD process may in turn comprise a plurality of cycles, with each cycle preferably comprising: contacting the substrate with a first reactant; removing the unreacted first reactant and possible reaction byproducts from the reaction chamber; contacting the substrate with water vapor; and removing the unreacted water vapor and possible reaction byproducts from the reaction chamber.

DETAILED DESCRIPTION OF THE PREFERRED EMBODIMENT

As discussed above, while it is desirable to replace $SiO_2$ in gate dielectrics with a high-permittivity or high dielectric constant (hereinafter "high-k") material, it is beneficial to have an ultra thin oxide interfacial layer between the substrate and the high-k material. Thus, it would be beneficial to be able to deposit a high-k material without increasing the thickness of a previously formed ultra thin oxide layer. Accordingly, the present invention discloses a method of producing an ultra thin oxide interfacial layer between the substrate and a high-k material, wherein the thickness of the interfacial layer is maintained during the deposition of the high-k dielectric material.

In the preferred embodiment, a silicon oxide ($SiO_2$) interfacial layer is prevented from growing during the deposition of the high-k material by using as the high-k material a metal oxide. Oxidation can only take place through the activity of an oxygen source used in the deposition process. By controlling the activity of the oxygen source, further growth of the $SiO_2$ layer is controlled. It is contemplated that the high-k material may be deposited by ALD. In one embodiment temperatures are preferably maintained below 300° C. and water vapor is used as a ligand exchange agent, thus preventing oxidation by the oxygen source during the high-k deposition. In other embodiments metal compounds, such as metal organic compounds, are used as the oxygen source material in ALD reactions, preventing further growth of the interfacial layer. In an alternate embodiment, deposition of metal oxides that are thermodynamically more stable than $SiO_2$ by MOCVD is contemplated, thus eliminating the use of an oxygen source entirely.

Figure 1:
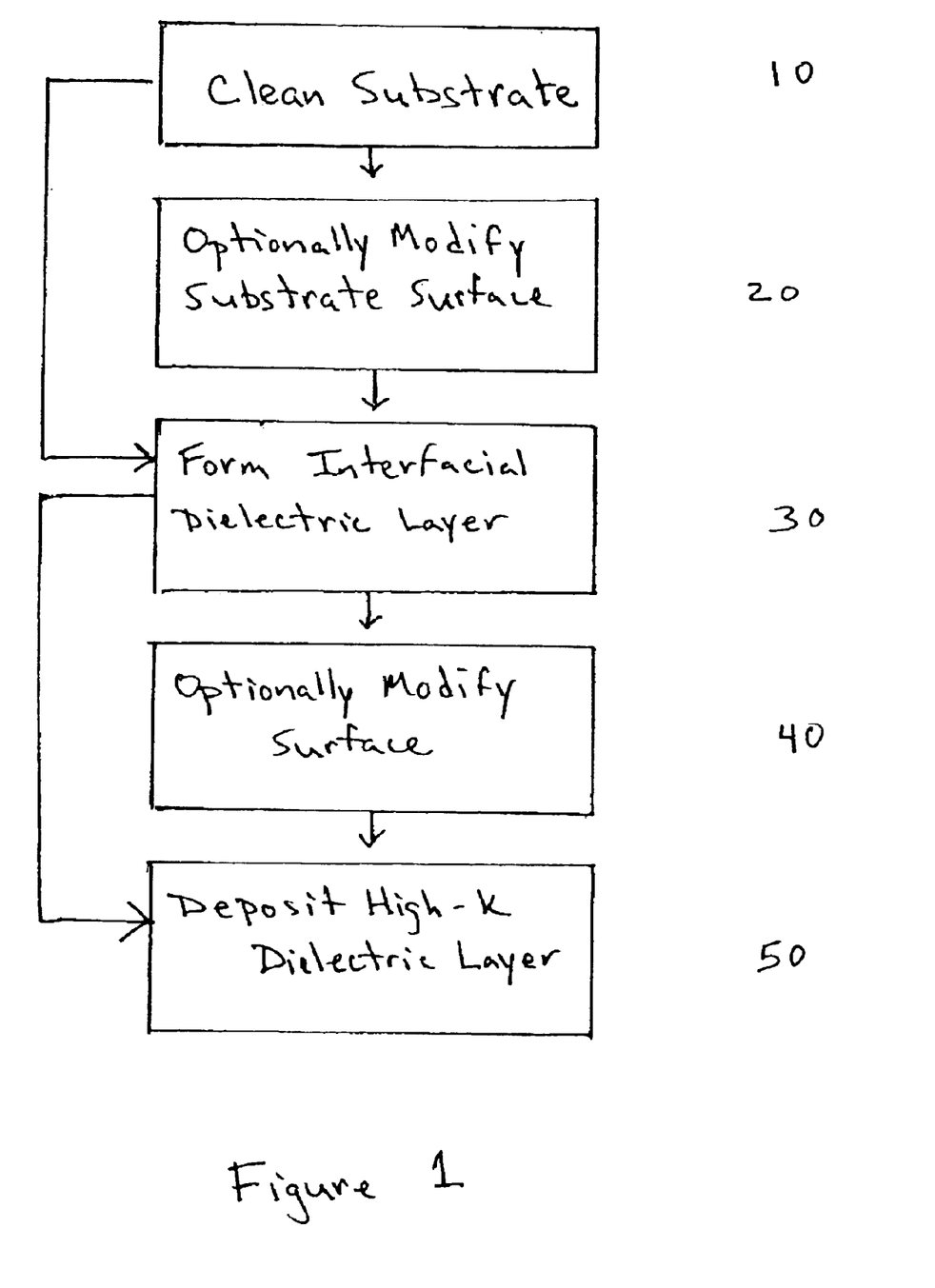
FIG. 1 shows a general process sequence for depositing an ultrathin interfacial dielectric material between the substrate and a high-k dielectric material in a gate dielectric.

FIG. 1 shows a general process sequence in accordance with the present invention. Preferably the substrate is first cleaned 10 to remove native oxide and contaminants. The surface may then optionally be modified 20 to facilitate the subsequent formation 30 of an ultra thin interfacial dielectric. Following formation 30 of the ultra thin interfacial dielectric, the surface may be subject to optional modification 40 to facilitate the subsequent deposition of the high-k dielectric layer 50. Preferred methods are described in the embodiments below, requiring no modification of the oxide surface prior to high-k deposition.

While illustrated in the context of a silicon substrate, the skilled artisan will readily find application for the principles disclosed herein to controlling film growth in a number of other contexts. It will be understood that the term "substrate" refers to any surface on which a layer is to be deposited. For example, thin oxide layers and high-k layers can be formed over metal surfaces. The preferred substrate is a semiconductor structure, such as an epitaxial silicon layer or the top surface of a monolithic silicon wafer. In this context, the skilled artisan will appreciate that the semiconductor substrate is the lowest level of semiconductor material from which devices are formed in an integrated circuit.

As illustrated, the substrate is cleaned 10 to remove contaminants and naturally occurring or native oxide on the semiconductor structure. Cleaning of the substrate may be achieved by any method known in the art. Conventionally, wafer cleaning prior to gate oxide growth is conducted ex situ before the wafer is loaded into the process chamber. For example, wafers may be cleaned in an HCl/HF wet etch bath. Alternatively, cleaning can be performed in situ. For example, an integrated HF and acetic acid vapor clean can be conducted in a module within a cluster tool, reducing transport time and opportunity for recontamination or re-oxidation. In another possibility, a hydrogen bake step can be conducted within the chamber to sublimate native oxide. Small amounts of HCl vapor can be added to this step to aid in cleaning metal contaminants and the like during the hydrogen bake. In still another arrangement, plasma products can assist or conduct in situ cleaning, such as by substituting H radicals for hydrogen gas. Advantageously, use of activated or excited species can widen the process temperature window for adequate cleaning.

In a preferred embodiment the substrate is subject to an APM (ammoniumhydroxide/peroxide mixture) clean. This may be followed by HF bath, which advantageously removes oxide resulting from the APM clean and leaves the substrate surface primarily H-terminated.

Following cleaning 10 and optional surface treatment 20 an interfacial dielectric layer is formed 30 over the substrate. Preferably the interfacial dielectric layer is ultra thin, comprising one or two monolayers. The interfacial dielectric preferably has a thickness of less than about 15 Å, more preferably less than about 10 Å and even more preferably less than about 5 Å. Formation 30 of the ultra thin dielectric oxide interface layer may be carried out by any method known in the art. Thus it may be "grown" from the substrate as by oxidation, or it may be "deposited" on the substrate by a process such as ALD or CVD. Preferably the interfacial dielectric is grown from the substrate.

If the interfacial oxide formation 30 is by oxidation, the substrate surface may optionally be treated 20 in a way that moderates the subsequent oxidation of the substrate and the resulting growth of an interfacial dielectric oxide layer, as disclosed in copending application Ser. No. 09/791,167, filed Feb. 22, 2001 now U.S. Pat. No. 6,492,283, the disclosure of which is incorporated herein by reference. The dangling bonds at the silicon surface following cleaning have a strong tendency to bond with groups or radicals present in the ambient atmosphere. After HF treatment, the silicon dangling bonds are practically completely terminated by atomic hydrogen or fluorine. Hydrogen is the smallest atom in existence and fluorine is the smallest halide atom. They do not provide any significant barrier for the diffusion of the oxidant to the silicon surface. However, the hydrogen or fluorine termination can be replaced by a termination with a larger group. The surface is then partially blocked, and the diffusion of the oxidant towards the surface proceeds more slowly. This substantially dampens the oxidation rate, particularly during the initial stages of the growth, which typically proceeds relatively quickly.

By selecting the size of the ligands, the permeability of the diffusion barrier can be tailored, the oxidation rate can be controlled, and the final oxide thickness can be adjusted. Furthermore, the increasing oxide thickness contributes to the overall diffusion barrier and the oxidation process has the tendency to be self-limiting in oxide thickness.

In one embodiment, exposure of the silicon surface to water vapor results in replacement of the hydrogen termination of the dangling bonds with an OH termination. The OH group is substantially larger than the H atom and thus already has a strong moderating effect on the oxidation rate. In addition to the diffusion barrier that is provided by the surface termination with ligands, other effects like bonding strength, polarity, etc. will be of influence to the oxidation rate. Consequently the mere occupation of the dangling bonds by ligands can and will influence the oxidation rate. Thus, in accordance with one embodiment, the ligands are OH groups formed by exposure to $H_2O$.

More preferably, the ligands are larger and more oxidation moderating than OH groups. For example, in another embodiment, the ligands comprise alkoxy tails, formed from exposure of the HF-cleaned surface to alkoxides or alcohols, such as methanol, ethanol and propanol. In yet another embodiment, the ligands comprise carboxylic tails, formed from exposure to carboxylic acids such as formic acid and acetic acid. In these more preferred embodiments, the ligands are provided after cleaning native oxide (preferably by HF treatment) from the surface and prior to oxidizing the surface. Optionally, the ligands are also provided during the oxidation step.

In one embodiment, with or without the optional oxidation moderating ligands described above, the interfacial dielectric is silicon oxide grown by exposure to a species that is reactive with the cleaned substrate, such as in thermal oxidation of the cleaned substrate. The oxidant source can comprise any number of known oxidants, particularly a volatile oxidant such as $O_2$, $H_2O$, HCOOH, and $HClO_4$. However, oxidation rates are preferably enhanced by providing oxidants more reactive than oxygen and/or by elevating the oxidation temperature, preferably to a temperature between about 50° C. and 400° C., more preferably between about 300° C. and 400° C. Desirably, process temperatures are maintained below about 400° C. during oxidation. As an example, a 5 Å thick layer of $SiO_2$ may be grown on a cleaned substrate by exposure to $O_3$ gas for 100 seconds at 400° C.

In one embodiment, the oxidant has a stronger oxidizing effect than oxygen or water vapor alone. Oxidation with such oxidizers can be conducted at lower temperatures, preferably less than about 300° C., more preferably less than about 200° C. An exemplary strong oxidizer, in accordance with this embodiment, is an ozone-containing gas. In an alternative embodiment, this ozone-containing gas is mixed with water vapor, oxygen or an inert gas like a noble gas or $N_2$. Another exemplary strong oxidizer comprises a peroxide-containing gas. An oxygen-containing source gas may be provided to a remote plasma generator to provide excited species for oxidation.

In an alternative embodiment, the oxidant is water vapor. Although at room temperature, the oxidation rate in water vapor is very low, the temperature can be increased to about 300° C. Furthermore, in this case ligands can be provided on the silicon surface that enhance the oxidation rate or the water vapor can be mixed with other gases that enhance the oxidation rate, like $O_2$, or halogen-containing gases like HCl. If desired, stronger oxidizing agents such as ozone or peroxide can also be provided during oxidation and/or elevated temperatures up to about 400° C. may be used.

The growth of the interfacial dielectric may also include nitrogen incorporation (e.g., by oxidation with NO or $N_2O$ or by nitridation with $NH_3$) to form, for example, an oxynitride interfacial dielectric. In one embodiment, after cleaning an interfacial dielectric is grown by introduction of about 1.5 slm NO gas while maintaining a 15 slm flow of $N_2$, assuming pure NO oxidant gas. The skilled artisan will understand that the flow rate may need adjustment for use of alternative oxidant gases (e.g., $O_2$, $H_2O$, $N_2O$, HCOOH, $HClO_4$, nitroalkanes such as $CH_3NO_2$, alkyl nitrates such as $(CH_3)_2CHONO_2$, mixtures or diluted oxidants). Temperature and pressure are maintained at about 780° C. and 50 Torr, respectively, and the $N_2$ flow is similarly maintained. In about 20 seconds, a layer of silicon oxynitride grows from the substrate to a thickness of about 0.5 nm. Nitrogen and/or oxygen radicals can also be used for oxide, nitride or oxynitride growth. In a preferred embodiment the outermost layer of silicon oxide is nitrided to form a nitride layer that resists further oxide growth. Thus, the interfacial dielectric layer preferably comprises $SiO_x$, $SiN_y$, or $SiO_xN_y$.

After completion of the oxidation, the supply of oxidant (and ligands, if supplied during oxidation) to the surface is stopped and the substrate is purged with an inert gas. Because it is grown from the substrate, the interfacial dielectric layer is compatible with the semiconductor substrate, and may serve to prevent interface charge trapping sites.

Following formation of the interfacial dielectric layer the surface termination provided by the optional surface treatment 20, if used, may be removed. In one embodiment organic ligands are replaced with —OH termination.

The interfacial oxide layer may alternatively be produced by any other methods known in the art. For example it may be produced by controlled deposition rather than oxidation of the substrate. In one embodiment an interfacial dielectric layer of $SiO_2$ is deposited by atomic layer deposition (ALD). In another embodiment an interfacial dielectric layer of $SiO_2$ is grown by chemical oxidation of the substrate.

The formation of an interfacial dielectric layer, such as a $SiO_2$ layer, with controlled thickness and optional —OH termination is followed by the deposition of a second thin dielectric layer in a manner that inhibits further growth of the underlying interfacial dielectric layer. Preferably the underlying dielectric layer grows by less than 10 Å, on average, during the deposition of the second dielectric layer, more preferably by less than 5 Å, on average, and even more preferably does not grow at all during deposition of the second dielectric layer. Desirably, the layer deposited over the interfacial dielectric layer is a high-k dielectric material. The high-k material has a higher dielectric constant than silicon oxide, preferably has a dielectric constant greater than 5, and more preferably has a dielectric constant greater than 10. The high-k material deposited on the interfacial dielectric layer may be any high-k material that can be deposited without substantially growing the interfacial dielectric layer. A preferred high-k material is a metal oxide. Several examples of high-k materials that can be used in the present invention are $ZrO_2$, $HfO_2$, $Al_2O_3$, $Ta_2O_5$, $TiO_2$, BST, ST, SBT, $Nb_2O_5$, and $La_2O_3$, as well as oxides of Sc, Y, Ce, Pr, Nd, Sm, Eu, Gd, Tb, Dy, Ho, Er, Tm, Yb or Lu, solid solutions of metal oxides and nanolaminates of metal oxides.

Controlling the thickness of the underlying interfacial dielectric layer on a monolayer scale to achieve a target thickness of a few monolayers is particularly advantageous for such high-k applications, since the total thickness limits the achievable capacitance and thickness variations can have significant impact upon overall uniformity of the compound dielectric. Non-uniformity results in higher than necessary equivalent oxide thickness, since the minimum thickness to avoid leakage must be employed, such that the non-uniform oxide is excessively thick elsewhere. Moreover, excessive gate dielectric variation can ultimately reduce production yield.

Accordingly, any deposition process that does not further grow the interfacial oxide layer may be used to form the high-k dielectric layer. For example, ALD, CVD, PVD, MOCVD, MBE or any other known method may be used to deposit the high-k material so long as conditions are maintained such that no further oxidation of the underlying layer occurs. These methods are preferably carried out at less than 400° C., more preferably less than about 300° C. and even more preferably less than about 200° C. The second layer may contribute barrier characteristics and resistance to hot carrier effects at the same time as enabling overall scaling of the gate dielectric due to a higher dielectric constant.

Depending on the source chemicals used, a further surface treatment can optionally be provided prior to deposition of the high-k material. For example, excited species treatment may serve to modify the surface termination of the interfacial layer and promote subsequent deposition.

In the preferred embodiment, the deposition of the high-k material is accomplished by an ALD-type deposition process, wherein alternated pulses of reactants saturate the surface, and each cycle leaves no more than about 1 monolayer of the dielectric material. Briefly, the substrate is subjected to alternately repeated surface reactions of source chemicals. Each cycle deposits, reacts or adsorbs a layer upon the substrate in a self-limiting manner. Preferably, each cycle comprises at least two distinct phases, wherein each phase is a saturative reaction with a self-limiting effect. Reactants are thus selected such that, under the preferred conditions, the amount of reactants that can be bound to the surface is determined by the number of available sites and incidentally by the physical size of chemisorbed species (including ligands). The layer left by a pulse is self-terminated with a surface that is non-reactive with the remaining chemistry of that pulse. After the self-limiting reaction has gone to completion, the unreacted source chemical is removed from the reaction space and the substrate is exposed to the next reactant.

Maximum step coverage on the substrate surface is obtained when no more than about a single molecular layer of source chemical molecules is chemisorbed in each pulse. Each subsequent pulse reacts with the surface left by the preceding pulse in a similarly self-limiting or self-terminating manner. The pulsing sequence is repeated until a dielectric layer of the desired thickness is grown.

Water vapor is preferably used as the oxygen source, replacing ligand termination of the previous pulse, because it does not substantially further grow the thin interfacial oxide at less than 300° C. Oxide regrowth is a particular concern during initial stages of the high-k deposition, since oxidants can readily diffuse through the few monolayers of high-k material and thin interfacial oxide. In the examples below, pulses of aluminum source gas or zirconium source gas are alternated with water vapor pulses, with intervening purge pulses. In the preferred embodiment the second dielectric layer comprises $Al_2O_3$ deposited from trimethyl aluminum (TMA) and water.

The temperature at which the high-k dielectric is deposited is preferably maintained low enough that the thickness of the interfacial dielectric layer does not increase. Thus, deposition of the high-k material is preferably carried out at a temperature below about 400° C. More preferably deposition is carried out at a temperature between about 70° C. and 300° C., and most preferably between about 200° C. and 300° C. In one embodiment, temperature is lowered from the temperature at which thermal oxidation was performed during interfacial dielectric growth to less than about 300° C. during high-k dielectric deposition. Pressure during the processes is preferably maintained between about 1 Torr and 80 Torr, more preferably at about 10 Torr.

In one embodiment, a silicon wafer is introduced to the reaction space of a Pulsar™ 2000 reactor (commercially available from ASM America, USA), which is designed for ALD processes, either before or after interfacial oxide growth. The reaction space is evacuated to vacuum with a mechanical vacuum pump. After evacuation the pressure of the reaction space is adjusted to about 5–10 mbar (absolute) with flowing nitrogen gas that has a purity of 99.9999%. Then the reaction space is stabilized at a temperature less than 300° C. Alternating vapor phase pulses of $(CH_3)_3Al$ (trimethyl aluminum; TMA) and $H_2O$, vaporized from external sources, are introduced into the reaction space and contacted with the substrate surface. The source chemical pulses are separated from each other with flowing nitrogen gas.

Each pulsing cycle consists of four basic steps:

$(CH_3)_3Al$ pulse
$N_2$ purge
$H_2O$ pulse
$N_2$ purge

An exemplary aluminum oxide deposition cycle is summarized in Table I.

TABLE I $Al_2O_3$

| Phase | Reactant | Temperature (° C.) | Pressure (mbar) | Time (sec) |
|---|---|---|---|---|
| pulse 1 | TMA | 300 | 5–10 | 0.2 |
| purge 1 | — | 300 | 5–10 | 1.1 |
| pulse 2 | $H_2O$ | 300 | 5–10 | 1.5 |
| purge 2 | — | 300 | 5–10 | 3.0 |

The number of cycles determines the thickness of the layer. The growth rate of $Al_2O_3$ from $(CH_3)_3Al$ and $H_2O$ is typically near 0.1 nm/cycle or 1 Å/cycle at 300° C., or about 3–4 cycles/monolayer ($Al_2O_3$ has a bulk lattice parameter of about 3 Å). The methyl terminations left by each TMA pulse self-terminate adsorption of each such pulse and also reduce the number of available chemisorption sites, such that less than a full monolayer forms with each pulse. The pulsing cycle is repeated sufficient times to produce the desired layer thickness. Aluminum oxide can serve as the only high-k material in the gate dielectric, or as a thin barrier layer prior to forming one or more additional dielectric layers.

In another arrangement, $ZrO_2$ is deposited by an ALD type process. $ZrCl_4$ vapor is introduced to the reaction chamber and exposed to the wafer surface for 1.5 s. This is referred to as pulse A in Table II below. The reaction chamber is purged with nitrogen gas for 3.0 s to remove surplus $ZrCl_4$ and byproducts from the reaction chamber. This is referred to as purge A. Then water vapor is introduced to the reaction chamber and exposed to the wafer surface for 3.0 s. This is referred to as pulse B. Residual $H_2O$ and reaction byproducts are removed by purging the reaction chamber for 4.0 s. This is referred to as purge B. During each of the reaction phases, the reactants are supplied in sufficient quantity, given other parameters, to saturate the surface.

This exemplary high-k deposition cycle is summarized in Table II.

TABLE II $ZrO_2$

| Phase | Reactant | Temperature (° C.) | Pressure (mbar) | Time (sec) |
|---|---|---|---|---|
| pulse A | $ZrCl_4$ | 300 | 5–10 | 1.5 |
| purge A | — | 300 | 5–10 | 3.0 |
| pulse B | $H_2O$ | 300 | 5–10 | 3.0 |
| purge B | — | 300 | 5–10 | 4.0 |

The average deposition rate is about 0.59 Å/cycle at 300° C. The cycle of Table II, consisting of pulse A, purge A, pulse B, purge B, may be repeated as many times as necessary to produce a layer of the desired thickness.

More generally, temperatures during the process preferably fall between about 200° C. and 300° C. For an amorphous $ZrO_2$ layer, the temperature is more preferably between about 200° C. and 250° C., and most preferably at about 225° C. For a crystalline film, the temperature is more preferably at the high end of this range, between about 250° C. and 300° C., and most preferably about 300° C. As will be appreciated by the skilled artisan, however, mixtures of amorphous and crystalline composition result at the boundary of these two regimes. The illustrated process produces a largely crystalline $ZrO_2$ film.

In the above example, the metal monolayer formed by each $ZrCl_4$ pulse is self-terminated with chloride, which does not readily react with excess $ZrCl_4$ under the preferred conditions. The preferred oxygen source gas, however, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of $ZrO_2$. More preferably, sufficient cycles are conducted to grow between about 20 Å and 40 Å and most preferably about 30 Å. The dielectric constant of the layer is between about 18 and 24.

Following high-k dielectric deposition, the deposited dielectric layer is optionally annealed to improve the quality of this layer. For example, the deposited dielectric layer may be subjected to a high temperature oxygen anneal, crystallizing the layer and filling any oxygen vacancies which might otherwise leave essentially metallic leakage paths. An anneal step may be carried out in situ in a reactor designed to minimize the risk of explosive or otherwise undesirable reactions among sequential reactants. Preferably the anneal is carried out under conditions that prevent further growth of the interfacial oxide layer.

It is also contemplated that an ALD process may be used to deposit the high-k layer wherein the ALD process uses two metal compounds, one of which is an oxygen source material that reacts well with another metal compound but which does not oxidize the substrate. Such a process is described in U.S. patent application Ser. No. 09/687,355, filed Oct. 13, 2000, the disclosure of which is incorporated herein by reference. In this method, the surface of the substrate is alternately reacted with a metal source material and an oxygen source material. However, the oxygen source material is preferably a metal alkoxide, a metal compound that has at least one organic ligand and where oxygen is bonded to at least one boron, silicon or metal atom. The metal alkoxide serves as both an oxygen and metal source when it reacts with a second metal compound, such as a metal halide, or a metal alkyl. In this process a high-k metal oxide can be deposited without further oxidation of the underlying substrate and thus without further growth of the interfacial oxide layer.

It is also contemplated that the high-k material can be deposited by direct decomposition of metal precursors in the absence of oxygen. These metal precursors preferably comprise both metal and oxygen and thus are able to form metal oxides without additional oxygen. In this case, the absence of an oxidizing agent would prevent further growth of the interfacial oxide layer. Preferred metal precursors are organic metal compounds. However, they may also be volatile anhydrous metal nitrates.

In addition, the high-k material can be deposited by metal organic chemical vapor deposition (MOCVD). In such an MOCVD process, an oxidant is used that does not substantially further grow the interfacial oxide layer at the temperature at which the process is carried out.

Dielectric deposition may be followed by formation of a transistor gate electrode over the dielectric stack. Advantageously, electrode formation may also be performed in situ. Accordingly, not only can a dielectric stack be formed in situ, but in the preferred embodiment the reactor and methods enable in situ processing of all steps in the formation of a transistor gate stack. Thus interfacial dielectric growth and second high-k dielectric deposition may be conducted in situ. Optionally, however, any or all of wafer cleaning, depositing dielectric layers, annealing and forming electrodes can be conducted in situ, that is, in the same process chamber or cluster tool without exposure to the atmosphere between steps.

Although the foregoing invention has been described in terms of certain preferred embodiments, other embodiments will be apparent to those of ordinary skill in the art. For example, while processes are specifically provided for forming gate dielectrics in an integrated circuit, the skilled artisan will recognize that the same principles can be applied to other contexts, such as the formation of a high-k dielectric over a silicon bottom electrode for a capacitor. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A process for forming a gate dielectric on a semiconductor substrate, the method comprising:
   growing an interfacial dielectric oxynitride layer from the substrate by thermal oxidation; and
   depositing a high-k layer over the interfacial dielectric layer by an atomic layer deposition (ALD) process under conditions such that the thickness of the interfacial dielectric layer increases by less than about 15 Å while depositing the high-k layer, wherein the ALD process comprises a plurality of cycles, each cycle comprising:
   contacting a substrate in a reaction chamber with a first reactant;
   removing the unreacted first reactant from the reaction chamber;
   contacting the substrate with water vapor; and
   removing the unreacted water vapor from the reaction chamber,
   and wherein water vapor is the only oxygen source used during deposition of the high-k layer.

2. The process of claim 1, wherein the temperature at which the high-k layer is deposited is less than or equal to 300° C.

3. The process of claim 1, wherein the thickness of the interfacial layer is less than about 15 Å.

4. The process of claim 3, wherein the thickness of the interfacial layer is less than about 10 Å.

5. The process of claim 4, wherein the thickness of the interfacial layer is less than about 5 Å.

6. The process of claim 1, wherein said interfacial dielectric oxynitride layer is $SiO_xN_y$.

7. The method of claim 1, wherein thermal oxidation comprises oxidation through an oxidation-moderating surface termination.

8. The process of claim 1, wherein the high-k layer comprises $Al_2O_3$.

9. The method of claim 8, wherein the first reactant is trimethyl aluminum (TMA).

10. The method of claim 1, wherein the high-k layer comprises $ZrO_2$.

11. The method of claim 10, wherein the first reactant is $ZrCl_4$.

12. The method of claim 1, wherein the thickness of the interface layer increases by less than about 10 Å during deposition of the high-k material.

13. The method of claim 1, wherein the thickness of the interface layer increases by less than about 5 Å during deposition of the high-k material.

14. The process of claim 1, wherein thermal oxidation comprises exposing the substrate to an oxidant selected from the group consisting of NO and $N_2O$.

15. A process for forming a compound dielectric layer on the surface of a substrate comprising forming an interfacial dielectric layer comprising nitrogen that is less than about 15 Å thick and depositing a high-k material directly on top of the interfacial dielectric layer by an atomic layer deposition (ALD) type process without growing the interfacial dielectric layer further, wherein the ALD process comprises sequentially and alternatingly exposing the substrate to a first reactant comprising a metal containing compound and water and wherein water is the only oxygen source chemical utilized during the deposition of the high-k layer.

16. The process of claim 15, wherein the interfacial layer is less than about 10 Å thick.

17. The process of claim 16, wherein the interfacial layer is less than about 5 Å thick.

18. The process of claim 15, further comprising cleaning the substrate prior to forming the interfacial layer.

19. The process of claim 15, wherein the substrate is silicon.

20. The process of claim 19, wherein the interfacial layer is formed by thermal oxidation of the silicon substrate with an oxidant selected from the group consisting of NO and $N_2O$.

21. The process of claim 15, wherein the high-k material is selected from the group consisting of $ZrO_2$, $HfO_2$, $Ta_2O_5$, $TiO_2$, BST, ST, SBT, $Al_2O_3$, $Nb_2O_5$ and $La_2O_3$.

22. The process of claim 15, wherein the water is water vapor.

23. The process of claim 15, wherein the temperature is less than 300° C.

24. The process of claim 15, wherein the temperature is less than 300° C.

25. The process of claim 15, wherein water vapor is used as an oxidizing agent.

26. The process of claim 15, wherein the interfacial layer is selected from the group consisting of $SiN_y$ and $SiO_xN_y$.

27. The process of claim 15, additionally comprising modifying any surface termination on the interfacial layer prior to depositing the high-k material.

28. A process for forming a compound dielectric layer on the surface of a substrate comprising forming an oxide layer less than about 15 Å thick and depositing a high-k material on top of the oxide layer by an atomic layer deposition (ALD) type process without growing the oxide layer further, wherein the atomic layer deposition type process comprises sequential surface reactions wherein the substrate is sequentially and alternatingly exposed to a first metal containing compound and a second oxidizing compound, and wherein the second oxidizing compound is a metal organic compound.

29. A process for forming a compound dielectric layer on the surface of a substrate comprising forming an oxide layer less than about 15 Å thick and depositing a high-k material on top of the oxide layer by an atomic layer deposition (ALD) type process without growing the oxide layer further, wherein the atomic layer deposition type process comprises sequential surface reactions wherein the substrate is sequentially and alternatingly exposed to a first metal containing compound and a second oxidizing compound, and wherein the first metal containing compound is a metal halide and the second oxidizing compound is a metal alkoxide.

30. A process for forming a compound dielectric layer on the surface of a substrate comprising forming an oxide layer less than about 15 Å thick and depositing a high-k material on top of the oxide layer by an atomic layer deposition (ALD) type process without growing the oxide layer further, wherein the atomic layer deposition type process comprises sequential surface reactions wherein the substrate is sequentially and alternatingly exposed to a first metal containing compound and a second oxidizing compound, and wherein the first metal containing compound and the second oxidizing compound are both metal alkoxides.

31. A process for forming a gate dielectric on a semiconductor substrate, the method comprising:

growing an interfacial dielectric oxide layer from the substrate by thermal oxidation; and depositing a high-k layer over the interfacial dielectric layer by an atomic layer deposition (ALD) process under conditions such that the thickness of the interfacial dielectric layer increases by less than about 15 Å while depositing the high-k layer, wherein the high-k material is deposited by direct decomposition of a metal source compound.

32. The process of claim 31, wherein the single metal source compound is the only reactant used in depositing the high-k layer.

33. A method of forming a dielectric layer on a silicon substrate comprising:

growing a silicon oxynitride interface layer on the substrate, the interface layer having a thickness of less than about 15 Å; and depositing a high-k material on top of the interface layer, wherein depositing comprises maintaining the substrate at a temperature less than about 300° C. and supplying water vapor as an oxidizing agent, and wherein the interface layer grows by less than about 15 Å during deposition of the high-k material, and wherein water vapor is the only oxidizing agent supplied during deposition of the high-k material.

34. The method of claim 33 wherein depositing comprises an ALD process.

35. The method of claim 34, wherein the ALD process comprises a plurality of cycles, each cycle comprising:

contacting the substrate with a first reactant;

removing the unreacted first reactant from the reaction chamber;

contacting the substrate with water vapor; and removing the unreacted water vapor from the reaction chamber.

36. The method of claim 33, wherein the interface layer grows by less than about 10 Å during deposition of the high-k material.

37. The method of claim 36, wherein the interface layer grows by less than about 5 Å during deposition of the high-k material.

38. The method of claim 33, wherein the interfacial layer is formed by oxidation of the silicon substrate with an oxidant selected from the group consisting of NO and $N_2O$.

* * * * *

UNITED STATES PATENT AND TRADEMARK OFFICE
CERTIFICATE OF CORRECTION

PATENT NO. : 6,806,145 B2
DATED : October 19, 2004
INVENTOR(S) : Haukka et al.

It is certified that error appears in the above-identified patent and that said Letters Patent is hereby corrected as shown below:

Title page,
Item [54], Title, "LOW TEMPERATURE METHOD OF FORMING A GATE STACK WITH A HIGH K LAYER DEPOSITED OVER AN INTERFACIAL OXIDE LAYER" should read -- LOW TEMPERATURE METHOD OF FORMING A GATE STACK WITH A HIGH K LAYER DEPOSITED OVER AN INTERFACIAL DIELECTRIC LAYER --

Signed and Sealed this

Twenty-second Day of February, 2005

JON W. DUDAS
*Director of the United States Patent and Trademark Office*